(12) United States Patent
Onuma

(10) Patent No.: US 12,265,120 B2
(45) Date of Patent: Apr. 1, 2025

(54) ERROR RATE MEASUREMENT APPARATUS AND ERROR RATE MEASUREMENT METHOD

(71) Applicant: ANRITSU CORPORATION, Kanagawa (JP)

(72) Inventor: Hiroyuki Onuma, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 10 days.

(21) Appl. No.: 18/318,396

(22) Filed: May 16, 2023

(65) Prior Publication Data

US 2024/0044974 A1 Feb. 8, 2024

(30) Foreign Application Priority Data

Aug. 5, 2022 (JP) ................................. 2022-125667

(51) Int. Cl.
*G01R 31/317* (2006.01)
*G01R 31/319* (2006.01)

(52) U.S. Cl.
CPC ... *G01R 31/3171* (2013.01); *G01R 31/31905* (2013.01)

(58) Field of Classification Search
CPC .............. G01R 31/3171; G01R 31/31905
See application file for complete search history.

(56) References Cited

U.S. PATENT DOCUMENTS

| 11,467,909 B1 * | 10/2022 | Jeon .................... G06F 13/4221 |
| 2010/0262795 A1 * | 10/2010 | Hetzler ............... G06F 11/1068 |
| | | 714/37 |
| 2022/0074987 A1 | 3/2022 | Kidokoro et al. |

FOREIGN PATENT DOCUMENTS

| JP | 2010224760 A | * 10/2010 |
| JP | 2012028883 A | * 2/2012 |
| JP | 2016200900 A | * 12/2016 |
| JP | 2022-043738 A | 3/2022 |

* cited by examiner

*Primary Examiner* — Mark D Featherstone
*Assistant Examiner* — Jeffrey Andrew Yang
(74) *Attorney, Agent, or Firm* — McDonald Hopkins LLC

(57) ABSTRACT

An error rate measurement apparatus includes a display control unit, an operation display unit, and a control unit. The display control unit displays a firsts coefficient value in a selectable manner by tabs of a number corresponding to a Full Swing value, performs matrix display on a display screen by using each one of combinations of each second coefficient value and each third coefficient value in the first coefficient value on the selected tab, and displays each coefficient value on the display screen in a three-dimensional bird-eye view by using each second coefficient value and each third coefficient value as a combination of a horizontal direction coordinate axis and a vertical direction coordinate axis and using the first coefficient value as a depth direction coordinate axis. The operation display unit selects a range including at least one cell as a scanning target in the matrix display or a bird-eye display.

6 Claims, 10 Drawing Sheets

FIG. 2

| Preset # | Preshoot2(dB) | Preshoot1(dB) | De-emphasis(dB) | C-2 | C-1 | C+1 | Va/Vd | Vb/Vd | Vc1/Vd | Vc2/Vd |
|---|---|---|---|---|---|---|---|---|---|---|
| Q0 | 0.0±0.5dB | 0.0±0.5dB | 0.0±0.5dB | 0.000 | 0.000 | 0.000 | 1.000 | 1.000 | 1.000 | 1.000 |
| Q1 | 0.0±0.5dB | 1.6±0.5dB | 0.0±0.5dB | 0.000 | -0.083 | 0.000 | 0.834 | 0.834 | 1.000 | 0.834 |
| Q2 | 0.0±0.5dB | 3.5±0.5dB | 0.0±0.5dB | 0.000 | -0.167 | 0.000 | 0.666 | 0.666 | 1.000 | 0.666 |
| Q3 | 0.0±0.5dB | 0.0±0.5dB | -1.6±0.5dB | 0.000 | 0.000 | -0.083 | 1.000 | 0.834 | 0.834 | 0.834 |
| Q4 | 0.0±0.5dB | 0.0±0.5dB | -3.5±0.5dB | 0.000 | 0.000 | -0.167 | 1.000 | 0.666 | 0.666 | 0.666 |
| Q5 | -1.3±0.5dB | 4.7±1.0dB | 0.0±0.5dB | 0.042 | -0.208 | 0.000 | 0.584 | 0.584 | 1.000 | 0.500 |
| Q6 | -1.6±0.5dB | 3.5±0.5dB | -3.5±0.5dB | 0.042 | -0.125 | -0.125 | 0.750 | 0.500 | 0.750 | 0.416 |
| Q7 | -2.9±0.5dB | 4.7±1.0dB | 0.0±0.5dB | 0.083 | -0.208 | 0.000 | 0.584 | 0.584 | 1.000 | 0.418 |
| Q8 | -3.5±0.5dB | 6.0±1.0dB | 0.0±0.5dB | 0.083 | -0.250 | 0.000 | 0.500 | 0.500 | 1.000 | 0.334 |
| Q9 | -4.4±1.0dB | 6.9±1.0dB | -1.6±0.5dB | 0.083 | -0.250 | -0.042 | 0.500 | 0.416 | 0.916 | 0.250 |
| Q10 | 0.0±0.5dB | 0.0±0.5dB | Note2 | 0.000 | 0.000 | Note2 | 1.000 | Note2 | Note2 | Note2 |

Notes:
1. Reduced swing signaling must implement presets Q0,Q1,Q2,Q3,andQ4.Full swing signaling must implement all the above presets.
2. Q10 boost limits are not fixed,since its de-emphasis level ia a function of the LF level that the Tx advertises during training.Q10 is used for testing the boost limit of Transmitter at full swing.Q4 is used for testing the boost limit of Transmitter at reduced swing.

ERROR RATE MEASUREMENT APPARATUS AND ERROR RATE MEASUREMENT METHOD

TECHNICAL FIELD

The present invention relates to an error rate measurement apparatus and an error rate measurement method for measuring a bit error rate (also referred to as a BER below) by transmitting a test signal based on a parameter value defined by the PCI Express6 standard to a device under test during link training in a state in which the device under test is transitioned to a state of signal pattern loopback and receiving a measurement target signal returned back from the device under test in response to the transmission of the test signal.

BACKGROUND ART

An error rate measurement apparatus is conventionally known as an apparatus that measures a BER by transmitting a test signal with a known pattern including fixed data to a device under test, and comparing a measurement target signal returned back and received from the device under test in response to the transmission of the test signal to a reference signal as a criterion in units of bits.

In this type of error rate measurement apparatus, as disclosed in Patent Document 1, for example, emphasis adjustment is performed on an output waveform of the device under test in link training. In order to secure communication quality with the device under test that is a link partner, it is necessary to select the optimum combination of transmission (Tx) side emphasis viewed from the error rate measurement apparatus and an equalizer freely set by a user on a reception (Rx) side of the device under test. Therefore, a conventional error rate measurement apparatus prior to the PCI Express 5.0 standard adopts a matrix scan function for scanning the optimum transmission (Tx) side equalizer for a receiver of the device under test and automatically searching for the optimum setting for the receiver of the device under test. In the matrix scan function compatible with the PCI Express 1-5 standard, a triangular matrix (X-axis, Y-axis) is mapped with two coefficients of Pre-shoot1 and De-emphasis, and the optimum BER is measured with the emphasis setting obtained by the coefficients.

RELATED ART DOCUMENT

Patent Document

[Patent Document 1] JP-A-2022-043738

DISCLOSURE OF THE INVENTION

Problem that the Invention is to Solve

However, in the conventional matrix scan function, when the optimum BER is measured with the emphasis setting obtained by the coefficient, only two types of measurements are supported: measurement for all cells in a triangular matrix by Full Scan, and measurement for all the cell after the measurement start cell in the triangular matrix. However, in the PCI Express6 standard, in addition to the conventional Cursor values (Pre-shoot1, De-emphasis), the Cursor value (Pre-shoot2) is increased, and emphasis is calculated with three coefficients, so that the number of the measurement items is three times or more the number of the conventional measurement items. Therefore, the conventional matrix scan function has a problem that it takes a long time to perform a BER measurement test of the PCI Express6 standard, and the device under test cannot be efficiently debugged.

The present invention has been made in view of the above problems, and an object of the present invention is to provide an error rate measurement apparatus and an error rate measurement method capable of efficiently performing a BER measurement test of the PCI Express6 standard and improving debugging efficiency of a user.

Means for Solving the Problem

In order to achieve the above object, according to a first aspect of the present invention, an error rate measurement apparatus 1 executes a matrix scan function of measuring a bit error rate by transmitting a test signal by a combination of coefficient values in a Full Swing value defined by the PCI Express standard to a device under test W during link training and receiving a measurement target signal returned back from the device under test in response to transmission of the test signal. The test signal is based on a parameter value of a cell to be scanned that is selected and set from a triangular matrix that is a combination of coefficient values. Three types of coefficient values are provided in the Full Swing value. The error rate measurement apparatus includes a display control unit that displays a first coefficient value in a selectable manner by tabs of a number corresponding to the Full Swing value, performs matrix display on a display screen by using each one of combinations of each second coefficient value and each third coefficient value in the first coefficient value on the selected tab, as the cell, and displays each coefficient value on the display screen in a three-dimensional bird-eye view by using each second coefficient value and each third coefficient value as a combination of a horizontal direction coordinate axis and a vertical direction coordinate axis, and using the first coefficient value as a depth direction coordinate axis, an operation display unit that selects a range including at least one cell as a scanning target in the matrix display or the bird-eye view display, and a control unit that executes the matrix scan function with a parameter value in the range selected by the operation display unit.

According to a second aspect of the present invention, in the error rate measurement apparatus in the first aspect, the first coefficient value is set as $C_{-2}$, each second coefficient value is set as $C_{+1}$, and each third coefficient value is set as $C_{-1}$. The error rate measurement apparatus further includes a storage unit that stores a plurality of scenarios including a cell with a combination of different parameter values. The control unit selects and sets one scenario from the plurality of scenarios stored in the storage unit, and executes a matrix scan function with the parameter value of the selected scenario.

According to a third aspect of the present invention, in the error rate measurement apparatus in the second aspect, the scenario includes a cell of a parameter value designated by the standard.

According to a fourth aspect of the present invention, there is provided an error rate measurement method for executing a matrix scan function for measuring a bit error rate by transmitting a test signal to a device under test (W) by a combination of coefficient values in a Full Swing value defined by a PCI Express standard during link training, and receiving a measurement target signal returned back from the device under test in response to transmission of the test signal. The test signal is based on a parameter value of a cell to be scanned that is selected and set from a triangular matrix that is a combination of coefficient values. Three types of coefficient values are provided in the Full Swing value. The error rate measurement method includes a step of displaying a first coefficient value in a selectable manner by tabs of a number corresponding to the Full Swing value, a step of performing matrix display on a display screen by using each one of combinations of each second coefficient value and each third coefficient value in the first coefficient value on the selected tab, as the cell, a step of displaying each coefficient value on the display screen in a three-dimensional bird-eye view by using each second coefficient value and each third coefficient value as a combination of a horizontal direction coordinate axis and a vertical direction coordinate axis, and using the first coefficient value as a depth direction coordinate axis, a step of selecting a range including at least one cell as a scanning target in the matrix display or the bird-eye view display, and a step of executing the matrix scan function with a parameter value in the range selected by the operation display unit.

According to a fifth aspect of the present invention, in the error rate measurement method in the fourth aspect, the first coefficient value is set as $C_{-2}$, each second coefficient value is set as $C_{+1}$, and each third coefficient value is set as $C_{-1}$. The error rate measurement method further includes a step of storing a plurality of scenarios including a cell with a combination of different parameter values, and a step of selecting and setting one scenario from the plurality of scenarios stored in the storage unit, and executing a matrix scan function with the parameter value of the selected scenario.

According to a sixth aspect of the present invention, the error rate measurement method in the fourth or fifth aspect further includes the scenario includes a cell of a parameter value designated by the standard.

Advantage of the Invention

According to the present invention, although the conventional matrix scan function only supports two types of measurements: measurement for all cells in the triangular matrix by Full Scan, and measurement for all cells after the measurement start cell in the triangular matrix, it is possible to widen the selection range of the scanning target, efficiently perform a BER measurement test of the PCI Express6 standard, and improve the debugging efficiency of the user.

BRIEF DESCRIPTION OF THE DRAWINGS

FIG. 2 is a diagram illustrating a matrix scan display screen when a [Measurement] tab is selected in the error rate measurement apparatus according to the present invention.

FIG. 7 is a diagram illustrating a Preset table of coefficient values defined by the PCI Express6 standard.

FIG. 8 is a diagram illustrating a triangular matrix of coefficient values when $C_{-2}=0/24$, which are defined by the PCI Express6 standard.

FIG. 9 is a diagram illustrating a triangular matrix of coefficient values when $C_{-2}=1/24$, which are defined by the PCI Express6 standard.

FIG. 10 is a diagram illustrating a triangular matrix of coefficient values when $C_{-2}=2/24$, which are defined by the PCI Express6 standard.

BEST MODE FOR CARRYING OUT THE INVENTION

Hereinafter, embodiments for implementing the present invention will be described in detail with reference to the accompanying drawings.

Overview of Present Invention

An error rate measurement apparatus according to the present invention uses a device that complies with PCI Express 6.0 shown in PCI Express Base Specification Revision 6.0 on 16 Dec. 2021 (referred to as the PCIe Gen6 standard below) as a connection standard for an expansion bus or an expansion slot, for example, as a device under test (DUT), transmits a test signal based on a parameter value defined by the PCIe Gen6 standard to the device under test during link training in a state where the device under test is transitioned to a state of signal pattern loopback, and measures a bit error rate of a measurement target signal returned and received from the device under test in response to transmission of the test signal.

Figure 6:
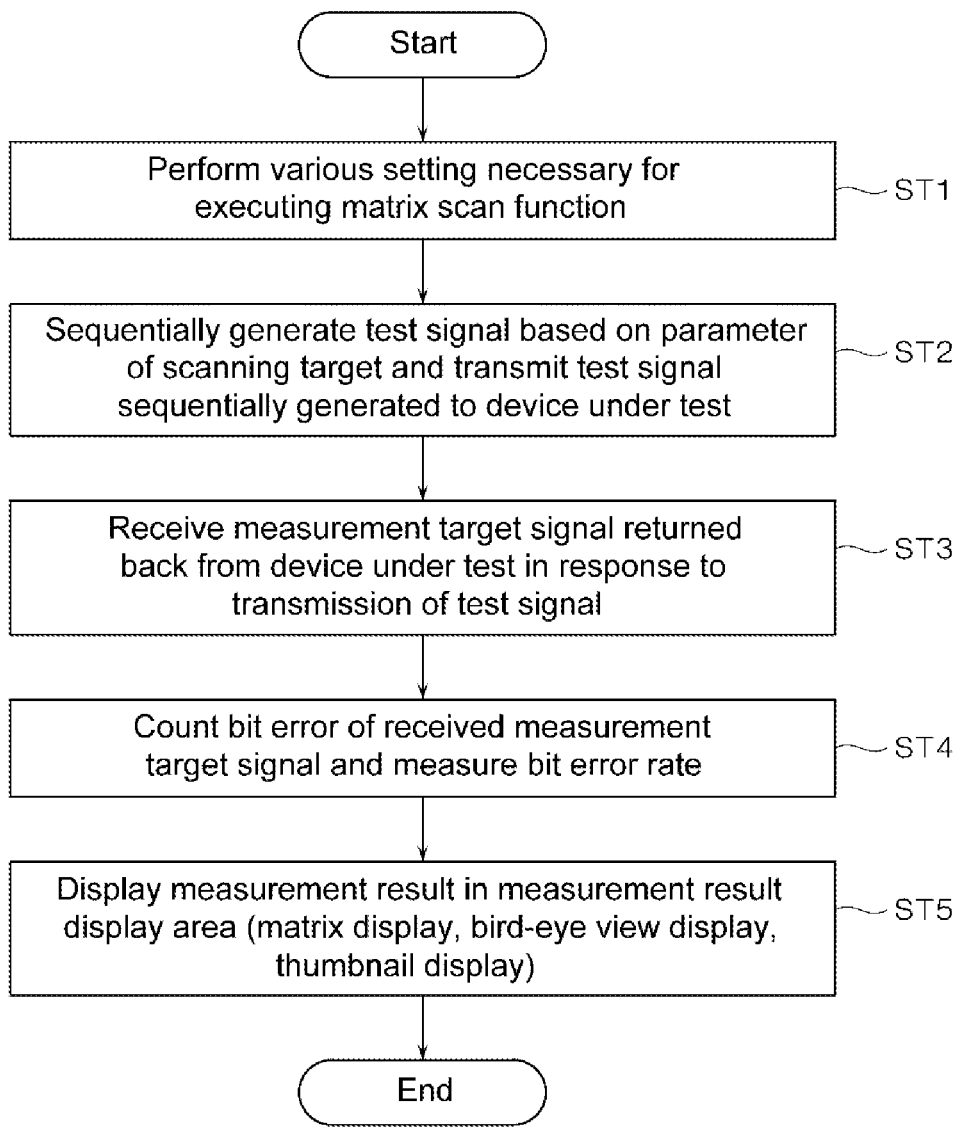
FIG. 6 is an operational flowchart of a matrix scan function of the error rate measurement apparatus according to the present invention.
Figure 8:
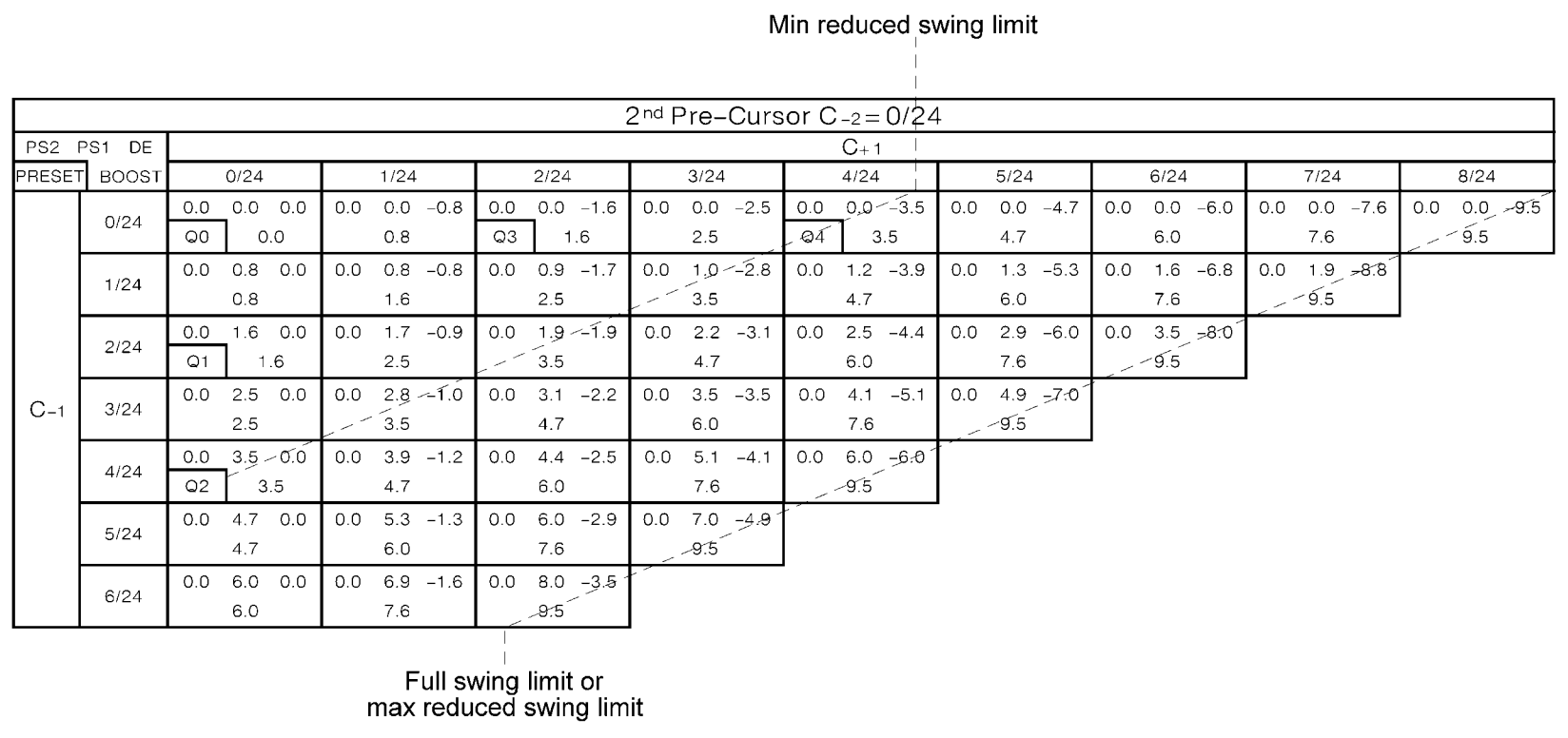

8.3.3.3 Tx Equalization Presets for 8.0, 16.0, 32.0, 1, and 64.0 GT/s of the PCIe Gen6 standard describes emphasis preset values as shown in FIG. 8-6 Definition of Tx Voltage Levels and Equalization Ratios, Table 8-1 Tx Preset Ratios and Corresponding Coefficient Values for 8.0, 16.0, and 32.0 GT/s, and Table 8-2 Tx Preset Ratios and Corresponding Coefficient Values for 64.0 GT/s (see FIG. 7).

Figure 9:
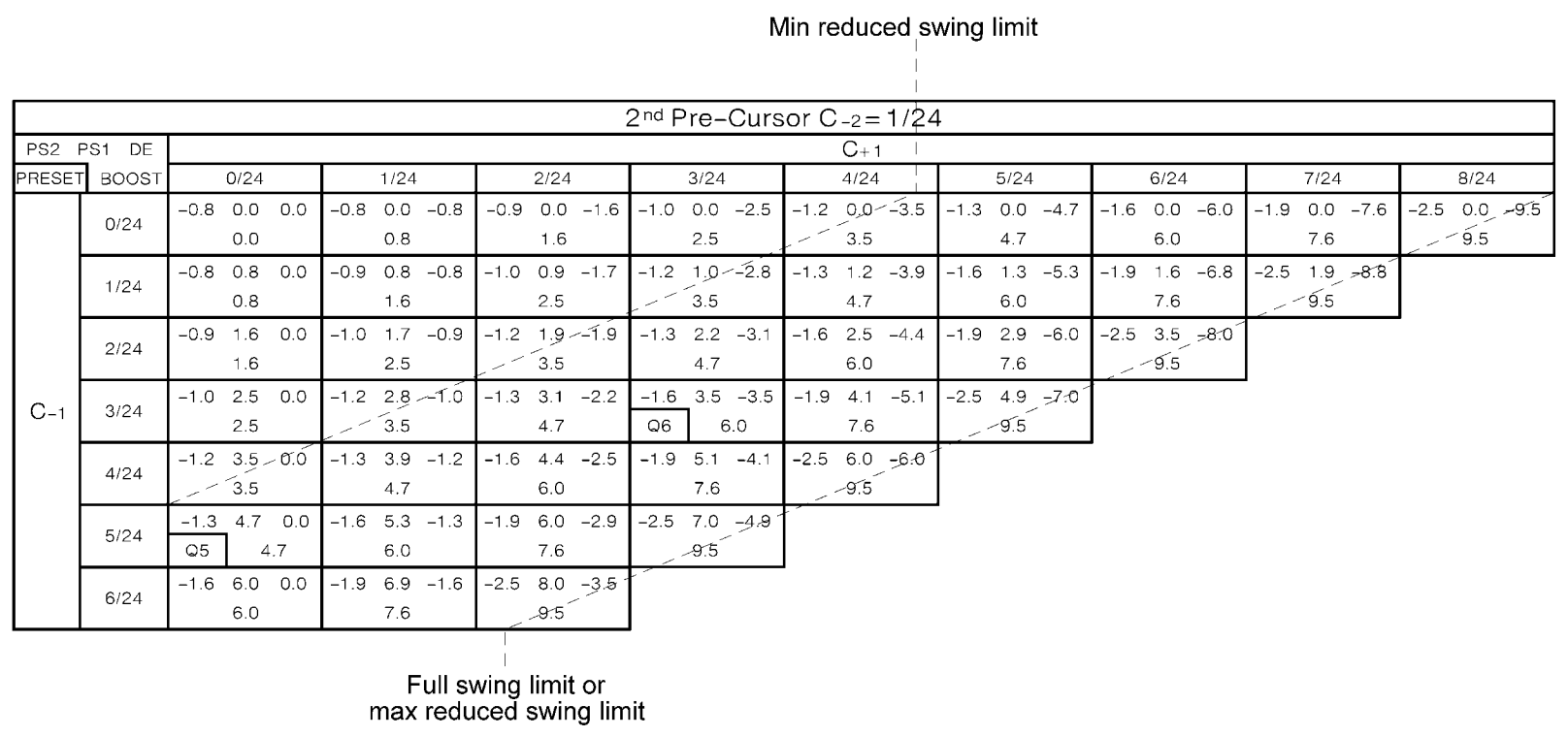
Figure 10:
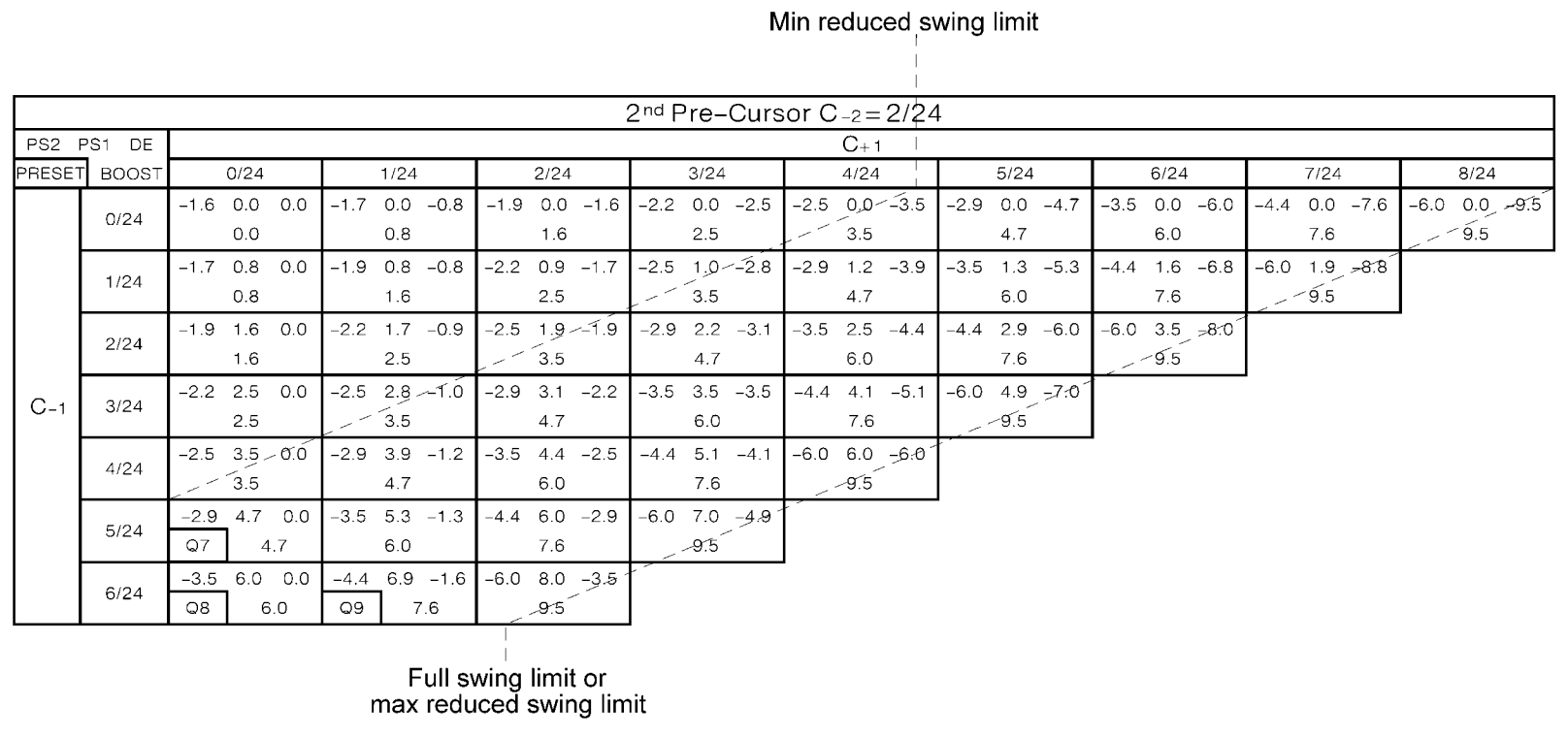

In addition, 8.3.3.8 Coefficient Range and Tolerance for 8.0, 16.0, 32.0, 1, and 64.0 GT/s of the PCIe Gen6 standard describes a table of a triangular matrix as shown in FIG. 8-10 Transmit Equalization Coefficient Space Triangular Matrix Example for 64.0 GT/s.

As a specific example of the table of the triangular matrix, FIG. 8 illustrates a triangular matrix of coefficient values when $C_{-2}=0/24$ defined by the PCIe Gen6 standard, and FIG. 9 illustrates a triangular matrix of coefficient values when $C_{-2}=1/24$ defined by the same standard, and FIG. 10 illustrates a triangular matrix of coefficient values when $C_{-2}=2/24$ defined by the same standard.

In particular, the object of the present invention is to visually grasp an optimum setting for a receiver of a device under test in the PCIe Gen6 standard in a manner that bit error measurement of a device under test is performed by executing a matrix scan function compatible with the PCIe Gen6 standard during link training for managing the state of a link with the device under test that is a device that complies with the PCIe Gen6 standard.

The matrix scan function is a function of automatically searching for an optimum setting for the receiver of the device under test by sequentially transmitting a test signal based on a parameter value of a cell as a scanning target selected and set from a triangular matrix in which mapping is performed with a combination of coefficient values of $C_{-2}$, $C_{-1}$, and $C_{+1}$ in a Full Swing value (any of 24, 48, and 63) defined by the PCIe Gen6 standard, to the device under test during link training, receiving a measurement target signal returned back from the device under test in response to this transmission, and measuring the bit error rate.

In the following description, an operation of executing the matrix scan function compatible with the PCIe Gen6 standard during link training to perform bit error measurement of the device under test is abbreviated as "bit error measurement".

Figure 1:
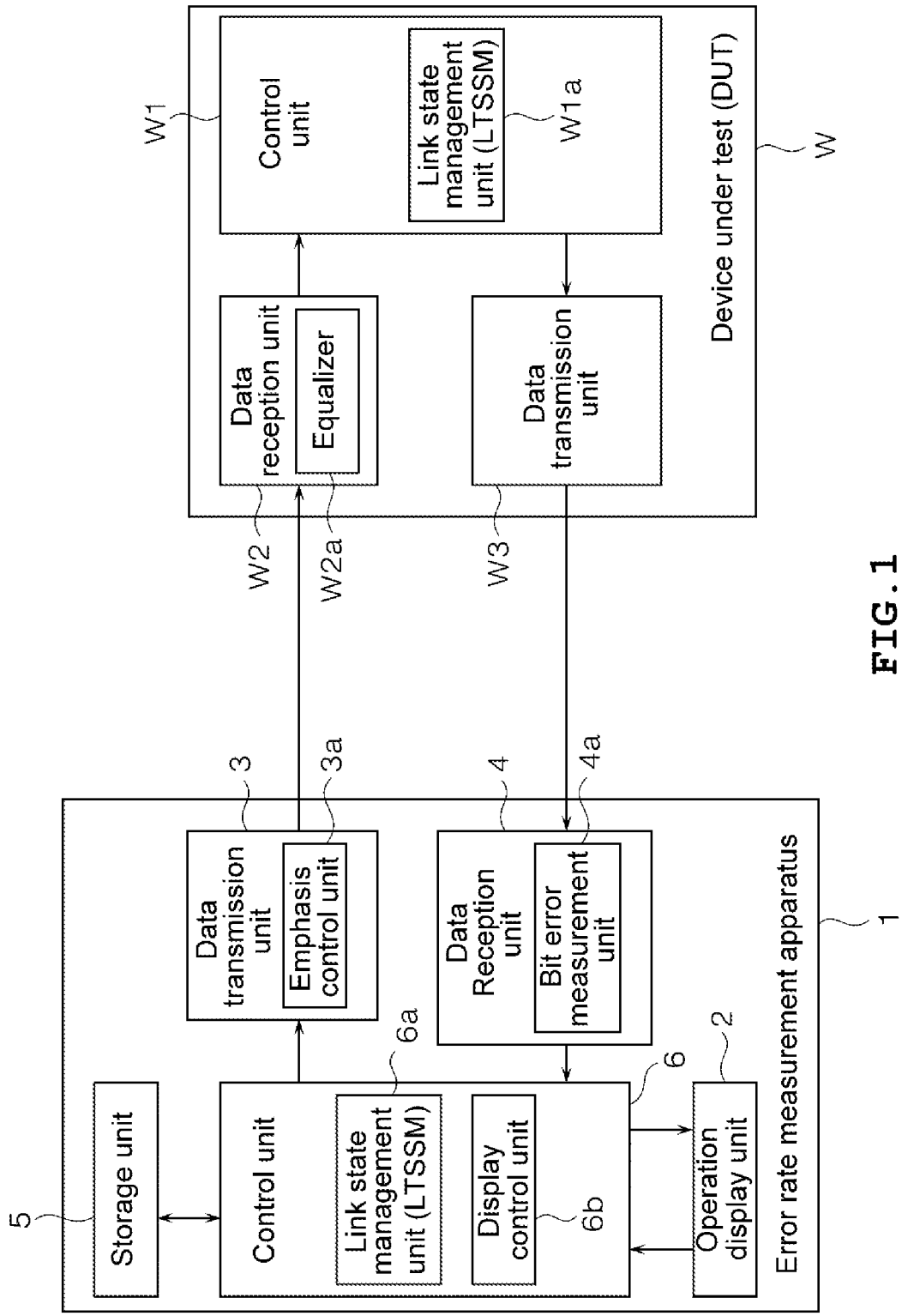
FIG. 1 is a block configuration diagram of an error rate measurement apparatus according to the present invention.

As illustrated in FIG. 1, an error rate measurement apparatus 1 in the present embodiment is roughly configured to include an operation display unit 2, a data transmission unit 3, a data reception unit 4, a storage unit 5, and a control unit 6 in order to achieve the above object.

As illustrated in FIG. 1, a device under test W is roughly configured to include a control unit W1, a data reception unit W2, and a data transmission unit W3. The configurations of the device under test W and the error rate measurement apparatus 1 will be described below with reference to the drawings.

[Regarding Configuration of Device Under Test]

The control unit W1 includes a link state management unit (LTSSM (Link Training and Status State Machine) W1a as a link state management mechanism for managing a link state. The control unit W1 collectively controls the data reception unit W2 and the data transmission unit W3 when performing bit error measurement.

When bit error measurement is performed, the data reception unit W2 receives a test signal transmitted from the data transmission unit 3 of the error rate measurement apparatus 1 in a state of signal pattern loopback, that is, a so-called loopback state under the control of the control unit W1.

The data reception unit W2 includes an equalizer W2a set freely by a user. The equalizer W2a adjusts the frequency characteristics of the test signal received from the data transmission unit 3 of the error rate measurement apparatus 1 to improve the reception sensitivity.

When the data reception unit W2 receives the test signal from the data transmission unit 3 of the error rate measurement apparatus 1 under the control of the control unit W1 during bit error measurement, the data transmission unit W3 returns and transmits a response signal to the received test signal as the measurement target signal to the error rate measurement apparatus 1.

[Regarding Configuration of Error Rate Measurement Apparatus]

The operation display unit 2 is configured by a graphical user interface (GUI) that has both functions of an operation unit that inputs various types of information related to bit error measurement by an operation and a display unit that displays screens related to bit error measurement settings and measurement results.

Figure 2:
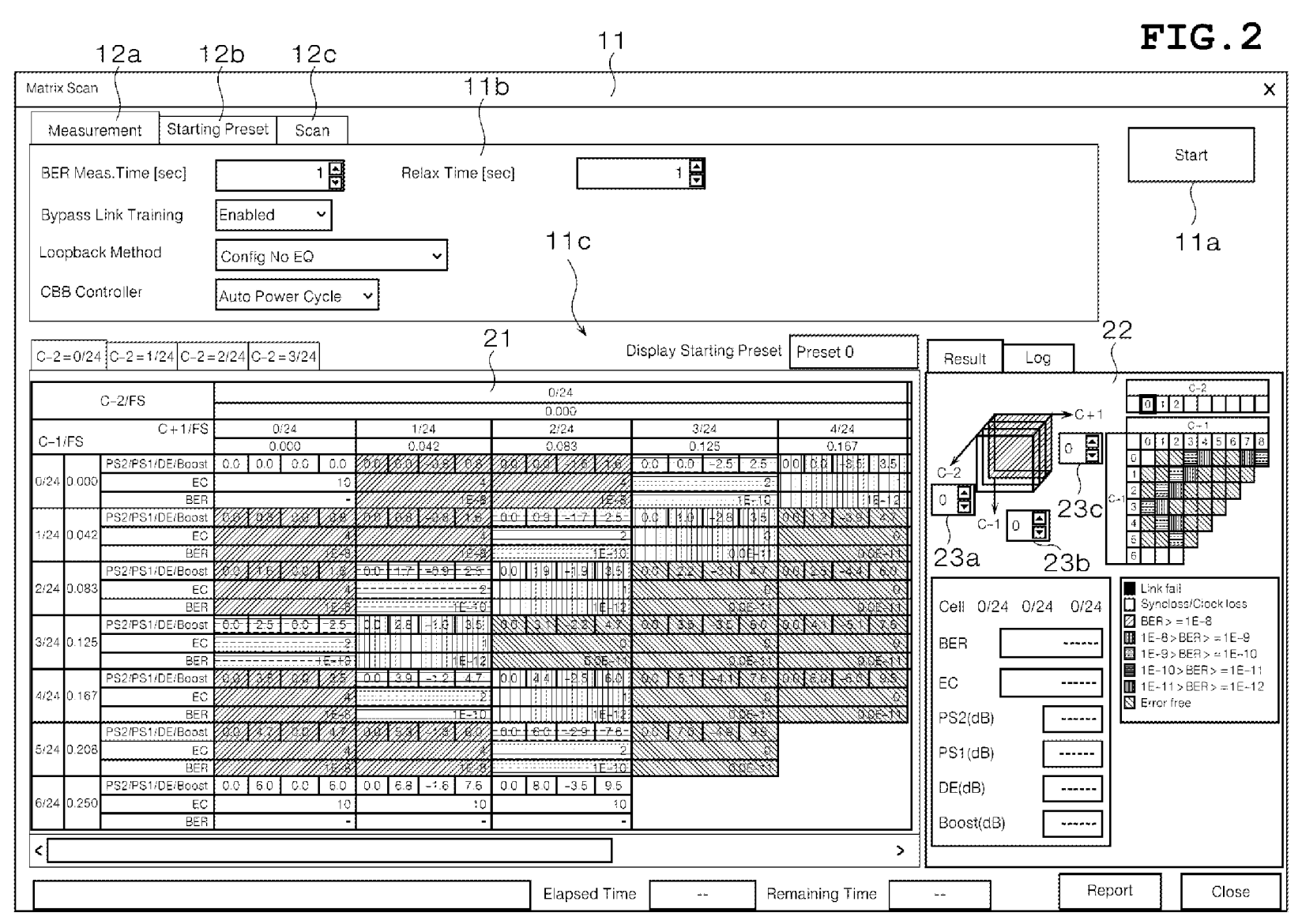
Figure 3:
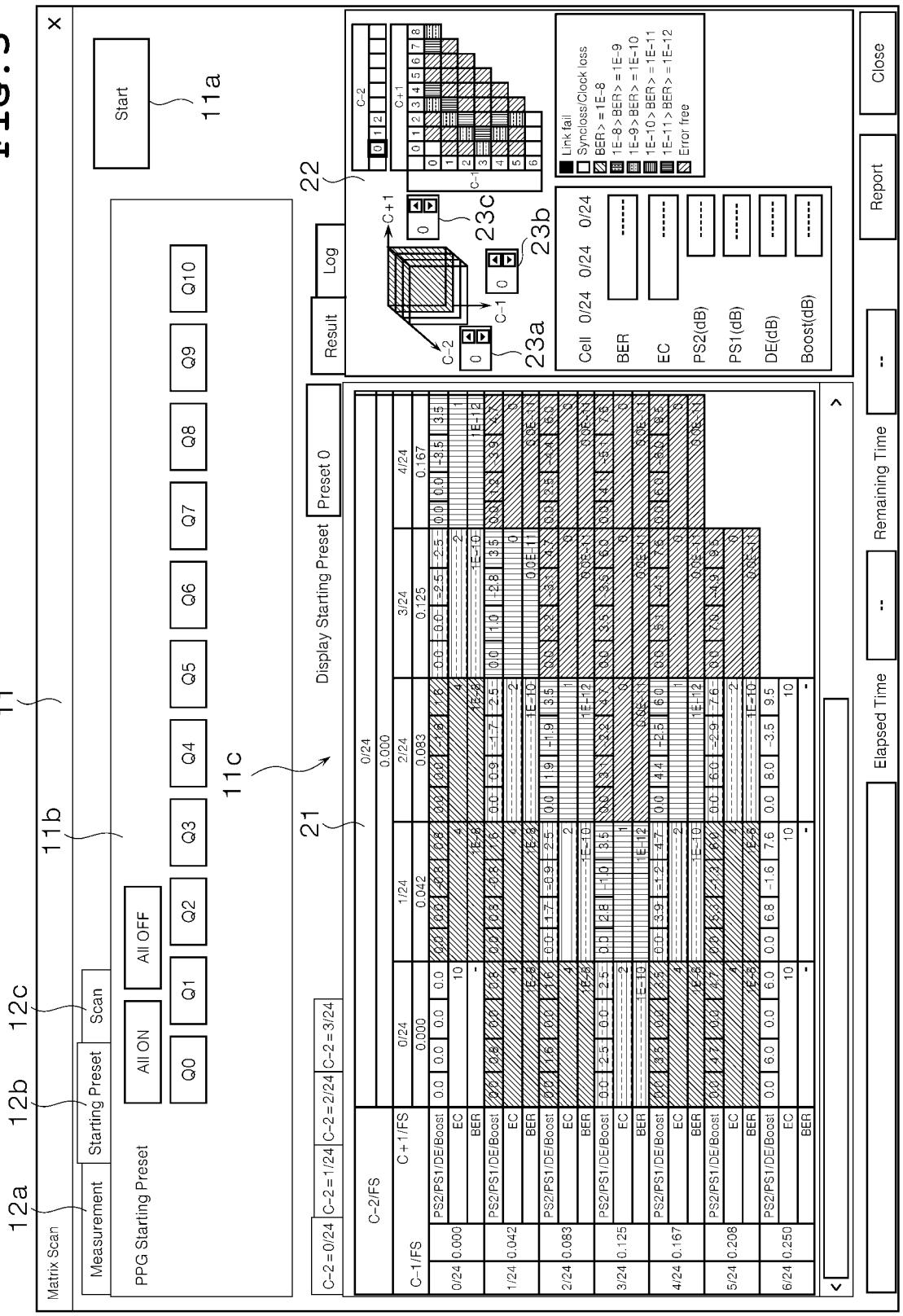
FIG. 3 is a diagram illustrating a matrix scan display screen when a [Starting Preset] tab is selected in the error rate measurement apparatus according to the present invention.
Figure 4:
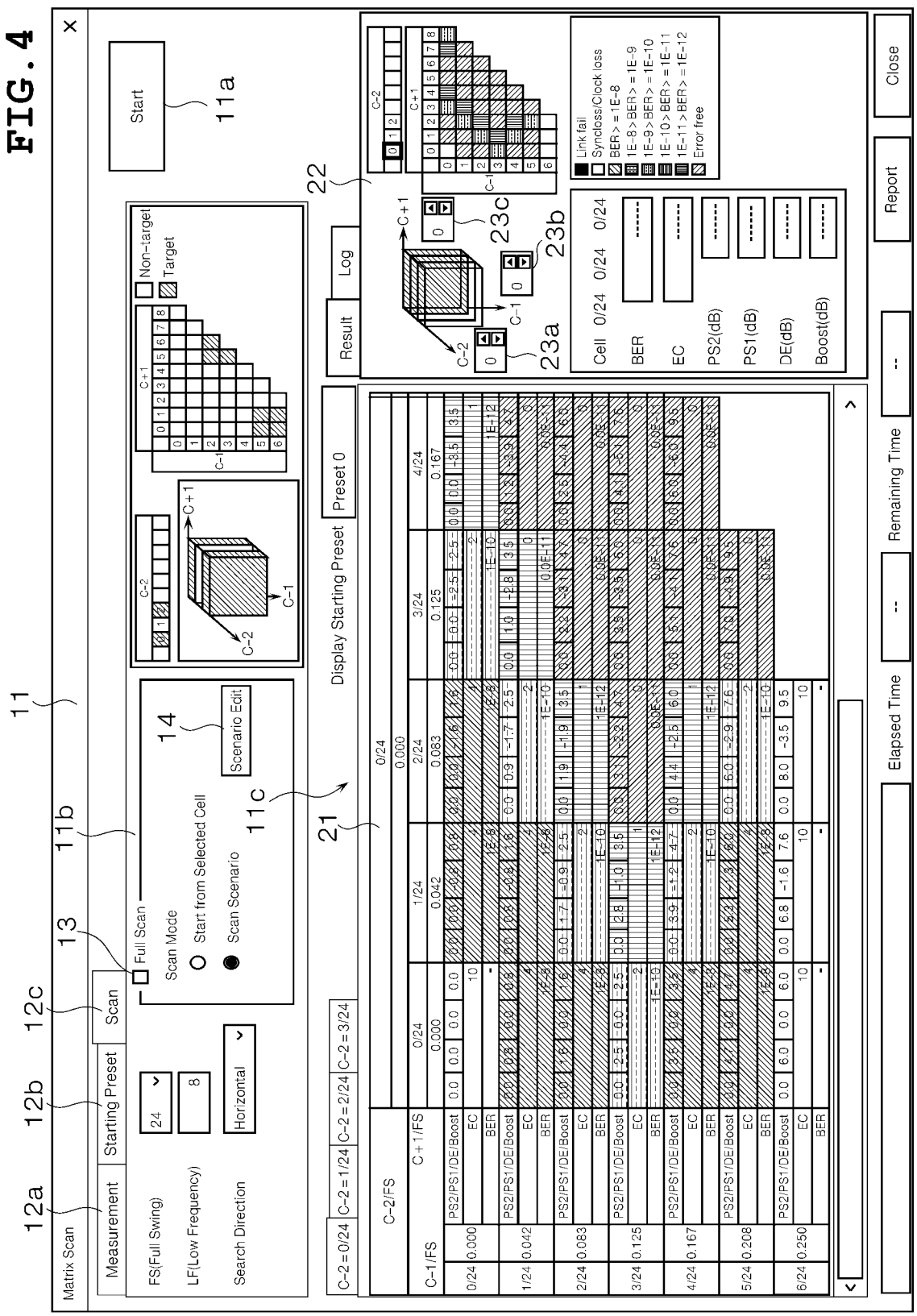
FIG. 4 is a diagram illustrating a matrix scan display screen when a [Scan] tab is selected in the error rate measurement apparatus according to the present invention.

The operation display unit 2 displays a matrix scan display screen 11 having display forms illustrated in FIGS. 2 to 4. At the upper right portion of the matrix scan display screen 11 illustrated in FIGS. 2 to 4, a "Start" key 11a which is pressed when the matrix scan function is executed. The matrix scan display screen 11 includes a parameter setting display area 11b for performing settings necessary for executing the matrix scan function, and a measurement result display area 11c for displaying the measurement results when the matrix scan function is executed.

The operation display unit 2 performs various settings necessary for executing the matrix scan function in the parameter setting display area 11b of the matrix scan display screen 11 illustrated in FIGS. 2 to 4. These various settings are performed in a state where any one of a "Measurement" tab 12a, a "Starting Preset" tab 12b, and a "Scan" tab 12c in the parameter setting display area 11b is selected.

First, a case where the "Measurement" tab 12a in the parameter setting display area 11b of FIG. 2 is selected will be described. In this case, in "BER Meas. Time [sec]", a BER measurement time can be set in a setting range of 1 to 300 sec in steps of 1 sec/step.

In "Relax Time", a Cursor setting time until BER measurement is started in a setting range of 1 to 60 secs and steps of 1 sec/step can be designated and set.

In "Bypass Link Training", whether to execute the matrix scan function with a link training setting can be set from a pull-down menu by selection of 1. Enabled (valid) or 2. Disabled (invalid). FIG. 2 illustrates a state in which "Enabled" is selected.

In "CBB Controller", a setting (Auto Power Cycle) for controlling a power supply for the device under test W connected to CBB4.0 can be selected from a pull-down menu.

Next, a case where the "Starting Preset" tab 12b in the parameter setting display area 11b of FIG. 3 is selected will be described. In this case, by pressing the "All ON" or "All OFF" button, it is possible to select or cancel all of the initial preset settings when bit error measurement is performed. In addition, by pressing any one of the buttons "Q0" to "Q10", it is possible to individually select or cancel the initial preset settings when bit error measurement is performed. The initial preset settings are performed as initial settings for adjusting the behavior of each DUT.

Next, a case where the "Scan" tab 12c in the parameter setting display area 11b of FIG. 4 is selected will be described. In this case, in "FS (Full Swing)", a Full Swing value of the matrix scan function can be set by selection from setting values of 24, 48, and 63 in a pull-down menu.

In "LF (Low Frequency)", a Low Frequency obtained from the Full Swing value of the matrix scan function is displayed. FIG. 4 illustrates a state in which Low Frequency of "8" obtained from the Full Swing value "24" is displayed.

In "Search Direction", a scanning direction can be set by selection from "Horizontal" (horizontal direction), "Vertical" (vertical direction), and "Depth" (depth direction) in the pull-down menu. FIG. 4 illustrates a state in which "Horizontal" is selected.

In "Full Scan", setting can be made by checking a check box 13 when the matrix scan function is executed for all cells. When the check box 13 for "Full Scan" is checked, "Scan Mode" is grayed out.

In "Scan Mode", a scanning method can be set by selecting "Start from Selected Cell" or "Scan Scenario" in a state where the check box 13 of "Full Scan" is not checked. FIG. 4 illustrates a state in which "Scan Scenario" is selected.

On the right side of "Full Scan", a scanning target is displayed in two formats of a three-dimensional format with three axes (X: horizontal direction coordinate axis, Y: vertical direction coordinate axis, Z: depth direction coordinate axis) and a table format. In the display of the scanning target in the three-dimensional format, $C_{-2}$, $C_{-1}$, and $C_{+1}$ are displayed in a three-dimensional bird-eye view by using $C_{-2}$ as the horizontal direction coordinate axis (X-axis), $C_{-1}$ as the vertical direction coordinate axis (Y-axis), and $C_{+1}$ as the depth direction coordinate axis (Z-axis). In the display of the scanning target in the table format, each coefficient value of $C_{-2}$ (0, 1, 2 in FIG. 4) is displayed independently above the display of the scanning target in the three-dimensional format, and a combination with each coefficient value (0, 1, 2) of $C_{-2}$ is displayed in a matrix by using each coefficient value (0 to 8) of $C_{+1}$ on the horizontal axis (X-axis) and each coefficient value (0 to 6) of $C_{-1}$ on the vertical axis (Y-axis). In the display of the scanning target by the three-dimensional format and the table format, the scanning target and a non-scanning target are identified and displayed in a color-coded manner. For example, color-coded display is performed in a manner that the scanning target is displayed in green and the non-scanning target is displayed in gray. In the present invention, $C_{-2}$ is used as a first coefficient value, $C_{+1}$ is used as a second coefficient value, and $C_{-1}$ is used as a third coefficient value. The coefficient value may be referred to as each coefficient value.

Figure 5:
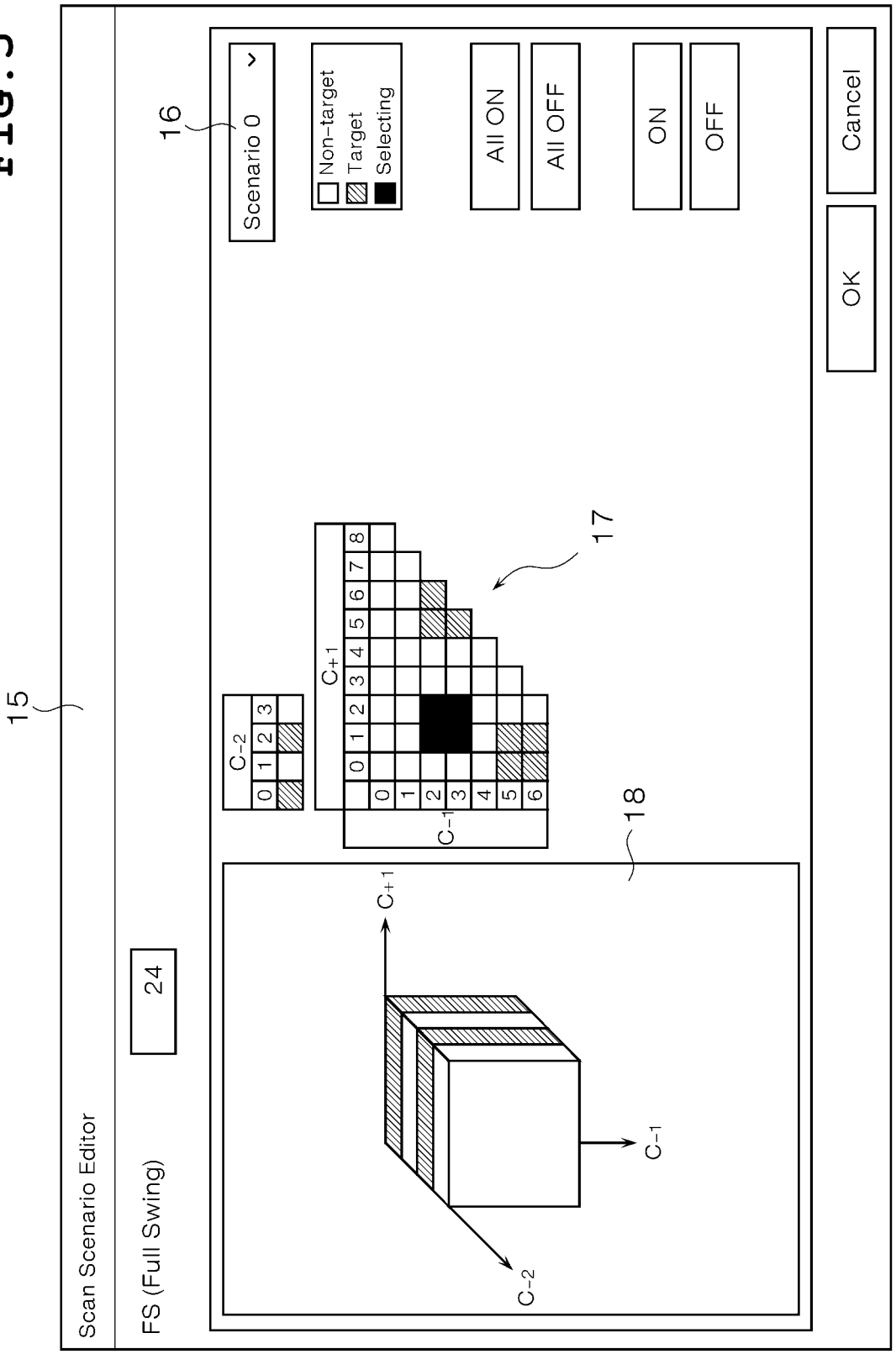
FIG. 5 is a diagram illustrating an example of a matrix scan edit screen in the error rate measurement apparatus according to the present invention.

Here, the "Scenario Edit" button 14 provided in the above-described "Full Scan" is operated when a matrix scan edit screen 15 illustrated in FIG. 5 is called by selecting "Start from Selected Cell" or "Scan Scenario" in a state where the check box 13 in "Full Scan" is not checked.

The matrix scan edit screen 15 of FIG. 5 is a screen for selecting a scanning target. The currently selected FS setting is displayed in "FS (Full Swing) display". FIG. 5 illustrates a case where the currently selected FS setting is "24".

An "Edit selection combo box" 16 for selecting a scanning target to be edited from a pull-down menu is displayed at the right top portion of the matrix scan edit screen 15.

When the user changes the scanning target, it may be difficult to select the scanning target depending on the Full Swing value (for example, 63 is selected and set). As a countermeasure, in the present embodiment, selection can be made from the pull-down menu of the "Edit selection combo box" 16 by preparing a plurality of scenarios (for example, Scenarios 0 to 5) including cells with different combinations of parameter values edited in advance. FIG. 5 illustrates a state in which "Scenario 0" is selected from the pull-down menu of the "Edit selection combo box" 16. The scenario to be prepared may include cells with parameter values designated by the PCIe Gen6 standard (parameter values of Preset Q0 to Q10 in FIG. 7).

A plurality of buttons of "All ON", "All OFF", "ON", and "OFF" are displayed to be vertically arranged under the "Edit selection combo box" 16. The "All ON" button is operated when all scanning targets are selected. The "All OFF" button is operated when all scanning targets are canceled. The "ON" button is operated when the selected matrix is used as the scanning target. The "OFF" button is operated when the selected matrix is excluded from the scanning target.

In the center of the matrix scan edit screen 15, a "Scan target selection matrix" 17 for selecting a cell set as the scanning target from the matrix with a mouse is displayed. FIG. 5 illustrates the "Scan target selection matrix" 17 when the Full Swing value is "24". $C_{-2}$: 0, 1, 2, 3 are displayed independently, and combinations of $C_{-1}$: 0 to 6 and $C_{+1}$: 0 to 8 with respect to $C_{-2}$: 0, 1, 2, 3 are displayed as a matrix. In the "Scan target selection matrix" 17, selected cells, targets, and non-targets are displayed in a color-coded manner. In FIG. 5, a combination in which $C_{-1}$: 2, $C_{+1}$: 1, $C_{-1}$: 2, $C_{+1}$: 2, $C_{-1}$: 3, $C_{+1}$: 1, $C_{-1}$: 3, $C_{+1}$: 2 are selected with respect to $C_{-2}$: 0, 4 is displayed as the selected cell in light blue (black portions in FIG. 5), and a combination of $C_{-1}$: 2, $C_{+1}$: 5, $C_{-1}$: 2, $C_{+1}$: 6, $C_{-1}$: 3, $C_{+1}$: 5, $C_{-1}$: 5, $C_{+1}$: 0, $C_{-1}$: 5, $C_{+1}$: 1, $C_{-1}$: 6, $C_{+1}$: 0, $C_{-1}$: 6, $C_{+1}$: 1 in $C_{-2}$: 0, 4 are displayed as targets in green (portions shaded from the upper right in FIG. 5), and the remaining portions are displayed as non-targets in gray (white portions in FIG. 5).

On the left side of the "Scan target selection matrix" 17, a "Scan target diagram" 18 for three-dimensionally representing the scanning target of $C_{-2}$ is displayed. In the "Scan target diagram" 18, $C_{-2}$, $C_{-1}$, and $C_{+1}$ are displayed in a three-dimensional bird-eye view by using $C_{-2}$ as the horizontal direction coordinate axis (X-axis), $C_{-1}$ as the vertical direction coordinate axis (Y-axis), and $C_{+1}$ as the depth direction coordinate axis (Z-axis), and the scanning target of $C_{-2}$ is displayed in a color-coded manner. For example, the scanning target of $C_{-2}$ is displayed in green, and the non-scanning target is displayed in gray. In the "Scan target diagram" 18, a plane set as the scanning target of $C_{-2}$ is three-dimensionally displayed.

An "OK" button provided at the bottom right portion of the matrix scan edit screen 15 is operated when the editing result is saved. A "Cancel" button adjacent to the right of the "OK" button is operated when the editing result is discarded.

The operation display unit 2 displays the measurement result when the matrix scan function is executed, in the measurement result display area 11c of the matrix scan display screen 11 illustrated in FIGS. 2 to 4. In the measurement result display area 11c in FIGS. 2 to 4, PS2 indicates Pre-Shoot2 (dB), PS1 indicates Pre-Shoot1 (dB), and DE indicates De-Emphasis (dB).

As illustrated in FIGS. 2 to 4, the measurement result display area 11c includes a table display area 21 and a detailed display area 22. In the table display area 21, the coefficient value of $C_{-2}$ is displayed to be selectable by tabs of a number corresponding to the Full Swing value (four tabs when the Full Swing value is 24, seven tabs when the Full Swing value is 48, and nine tabs when the Full Swing value is 63). Each one combination of the coefficient value of $C_{-2}$, each coefficient value of $C_{+1}$, and each coefficient value of $C_{-1}$ on the selected tab, that is, each one of combinations of the coefficient value of $C_{-2}$, the coefficient value of $C_{+1}$, and the coefficient value of $C_{-1}$ is set as a cell. An error count value (EC in FIGS. 2 to 4) and the bit error rate (BER in FIGS. 2 to 4) for each cell when the matrix scan function is executed are displayed in a matrix, and the bit error rate for each cell is displayed in a color-coded manner according to an error degree.

In each cell, not only values of PS2, PS1, DE, and Boost calculated using correction expressions (1) to (4) described later, but also the error count value and the bit error rate are displayed. At this time, the bit error rate for each cell is displayed in a color-coded manner according to the error degree, for example, according to Link fail (black portions in FIGS. 2 to 4: gray), Sync loss/Clock loss (white portions in FIGS. 2 to 4: red), BER≥1E-8 (portions shaded from the upper right in FIGS. 2 to 4: red orange), 1E-8>BER≥1E-9 (portions of vertical lines alternating solid lines and dotted lines in FIGS. 2 to 4: orange), 1E-9>BER≥1E-10 (portions of horizontal lines alternating solid lines and dotted lines in FIGS. 2 to 4: yellow), 1E-10>BER≥1E-11 (portions of solid horizontal lines in FIGS. 2 to 4: yellowish green), 1E-11>BER≥1E-12 (solid vertical lines in FIGS. 2 to 4: green), and Error free (portions shaded to the lower right in FIGS. 2 to 4: dark green).

In FIGS. 2 to 4, matrix display is made by using each coefficient value of $C_{+1}$ on the horizontal axis (X-axis) and each coefficient value of $C_{-1}$ on the vertical axis (Y-axis). The matrix display may be made by using each coefficient value of $C_{+1}$ on the vertical axis (Y-axis) and each coefficient value of $C_{-1}$ on the horizontal axis (X-axis).

In the detailed display area 22, a reduced image in which the bit error rate for each cell is color-coded according to the error degree is displayed as a thumbnail image. In this thumbnail display, each coefficient value of $C_{-2}$ (0, 1, 2 in FIGS. 2 to 4) is independently displayed. A matrix is displayed as a combination with each coefficient value (0, 1, 2) of $C_{-2}$, by using each coefficient value (0 to 8) of $C_{+1}$ on the horizontal axis (X-axis) and each coefficient value (0 to 6) of $C_{-1}$ on the vertical axis (Y-axis). In addition, similarly to the display of the table display area 21, the bit error rate for each cell is color-coded according to the error degree, and the thumbnail of the reduced image is displayed.

On the left side of the thumbnail display in the detailed display area 22, $C_{-2}$, $C_{-1}$, and $C_{+1}$ are displayed in a three-dimensional bird-eye view by using $C_{+1}$ as the horizontal direction coordinate axis (X-axis), $C_{-1}$ as the vertical direction coordinate axis (Y-axis), and $C_{-2}$ as the depth direction coordinate axis (Z-axis). As a result, by using $C_{-2}$ that is newly added by updating the standard, as the depth direction coordinate axis (Z-axis), it is possible to perform a three-dimensional bird-eye view display that utilizes the conventional display.

An input box 23a for inputting the coefficient value of $C_{-2}$ by operating the increase/decrease keys is provided near $C_{-2}$ in the bird-eye view display in the detailed display area 22. Similarly, an input box 23b for inputting the coefficient value of $C_{-1}$ by operating the increase/decrease keys is provided near $C_{-1}$, and an input box 23c for inputting the coefficient value of $C_{+1}$ by operating the increase/decrease keys is provided near $C_{+1}$. The portions (rectangular portions) corresponding to the coefficient values of $C_{-2}$, $C_{-1}$, and $C_{+1}$ based on the values input to the respective input boxes 23a, 23b, and 23c are identified and displayed, for example, in green.

In the three-dimensional bird-eye view display, the coordinate axis of $C_{+1}$ and the coordinate axis of $C_{-1}$ are aligned with the matrix display. That is, in FIGS. 2 to 4, the matrix is displayed by using $C_{+1}$ on the horizontal axis (X-axis) and $C_{-1}$ on the vertical axis (Y-axis). Thus, $C_{+1}$ is used for the horizontal direction coordinate axis (X-axis), and $C_{-1}$ is used for the vertical direction coordinate axis (Y-axis).

The BER (bit error rate), the EC (error count value), PS2 (dB), PS1 (dB), DE (dB), and Boost (dB) of the cell by the combination of coefficient values of $C_{-2}$, $C_{-1}$, and $C_{+1}$, which are input to the input boxes 23a, 23b, and 23c of the bird-eye display are displayed under the bird-eye view display in the detailed display area 22. In FIG. 4, the BER, the EC, PS2 (dB), PS1 (dB), DE (dB), Boost (dB) of the cell by the combination of $C_{-2}$=0, $C_{-1}$=0, $C_{+1}$=0 are displayed.

The operation display unit 2 can select a test pattern as an original of a test signal to be transmitted to the device under test W, on a setting screen (not illustrated). The test pattern can be selected from PRBS (Pseudo Random Bit Sequence) and Compliance (1b/1b encoded test pattern complying with the PCIe Gen6 standard). Compliance can be further selected from MCP (test pattern for BER measurement), CP (test pattern used for waveform calibration or Init Tx EQ. Tx LEQ Response Time Test), Jitter Measurement Pattern (pattern of 1, 0 for measuring Jitter).

Further, FIG. 1 illustrates a configuration in which the operation display unit 2 has both functions of the operation unit that inputs various types of information by the operation and the display unit that displays setting screens, measurement screens, and the like, but a configuration in which the operation display unit 2 is made independent of the operation unit and the display unit may be made.

The data transmission unit 3 generates a test signal and transmits the test signal to the device under test W when bit error measurement is performed. The test signal is a signal obtained by emphasizing a test pattern selected by the operation display unit 2 based on the parameter value including the table of the triangular matrix mapped from each coefficient of the preset cursor value defined by the PCIe Gen6 standard.

More specifically, when any range of 24, 48, and 63 is selected as a settable range in FS (Full Swing) in a state where the tab 12c of [Scan] in the parameter setting display area 11b is selected, the data transmission unit 3 calculates Va, Vb, Vc1, Vc2, and Vd from the total amplitude value of the data transmission unit (signal generator) 3 and a ratio of emphasis (de-emphasis as an actual phenomenon) based on PS2, PS1, DE, and Boost in the combination of $C_{-2}$, $C_{-1}$, and $C_{+1}$ in all or the designated preset defined by the PCIe Gen6 standard in the selected range. In addition, the data transmission unit 3 transmits the test signal generated based on the calculation result to the device under test W.

When the test signal from the data transmission unit 3 is transmitted to the device under test W during bit error measurement, the data reception unit 4 receives data transmitted and returned by the data transmission unit W3 of the device under test W in response to the transmission of the test signal.

The storage unit 5 stores various types of setting information set by the operation display unit 2 when bit error measurement is performed, measurement results obtained by bit error measurement, scenario editing results on the matrix scan edit screen 15, and the like.

In order to generate the test signal when bit error measurement is performed, the storage unit 5 stores parameter values including the table of the triangular matrix mapped from each coefficient of the preset cursor value defined by the PCIe Gen6 standard, for each setting range (24, 48, 63), and stores correction expressions (1) to (4) for PS2, PS1, DE, and Boost as follows.

$$PS2=(1-2\times C_{+1}-2\times C_{-1}-2\times C_{-2})/(1-2\times C_{+1}-2\times C_{-1}) \quad \text{Correction expression (1)}$$

$$PS1=(1-2\times C_{+1})/(1-2\times C_{+1}-2\times C_{-1}) \quad \text{Correction expression (2)}$$

$$DE=(1-2\times C_{+1}-2\times C_{-1})/(1-2\times C_{-1}) \quad \text{Correction expression (3)}$$

$$Boost=1/(1-2\times C_{+1}-2\times C_{-1}) \quad \text{Correction expression (4)}$$

The control unit 6 includes a link state management unit 6a and a display control unit 6b, and collectively controls the operation display unit 2, the data transmission unit 3, the data reception unit 4, and the storage unit 5 to execute the matrix scan function.

The link state management unit 6a has an LTSSM as a mechanism that is the same as or equivalent to a link state management unit W1a mounted on the device under test W, and operates according to the PCIe Gen6 standard used.

More specifically, the link state management unit 6a recognizes the current link state of the link state management unit W1a of the device under test W by using a training pattern (TS1 Ordered Sets and TS2 Ordered Sets) transmitted and received to and from the device under test W (the data reception unit W2 and the data transmission unit W3). Specifically, the link state management unit 6a obtains various types of information such as a link speed, the presence or absence of loopback, a lane number for identifying a lane, a link number, a generation time and the number of times of generating a pattern signal, an emphasis amount, and an adjustment value of an equalizer.

When bit error measurement is performed, the display control unit 6b controls the operation display unit 2 that is to display various types of information and measurement results necessary for executing the matrix scan function as the matrix scan display screen 11 having the display format illustrated in FIGS. 2 to 4, for example.

Next, the operation when the error rate measurement apparatus 1 configured as described above performs bit error measurement will be described with reference to the flowchart of FIG. 6. It is assumed that, when bit error measurement is performed, the device under test W is transitioned to a state of signal pattern loopback.

First, by the operation of the operation display unit 2 in the error rate measurement apparatus 1, various settings necessary for executing the matrix scan function are performed (ST1). To give an example of essential setting contents, in a state where the [Measurement] tab 12a in the parameter setting display area 11b of the matrix scan display screen 11 in FIG. 2 is selected, the BER measurement time is set in "BER Meas Time", "Enabled" is selected from the pull-down menu of "Bypass Link Training", and a setting for executing the matrix scan function is enabled in the setting of Link Training. Also, in a state where the [Scan] tab 12c in the parameter setting display area 11b of the matrix display screen 11 is selected, the Full Swing value (any of 24, 48, or 63) is selected and set in "FS (Full Swing)", the scanning direction (for example, Horizontal (horizontal direction)) is set in "Search Direction", and the check box 13 of "Full Scan" is checked or "Start from Selected Cell" or "Scan Scenario" in "Scan Mode" is selected to set the scanning target.

Furthermore, a setting method of the scanning target will be described. First, when the matrix scan function is executed for all cells, the check box 13 of "Full Scan" is checked in a state where the "Scan" tab 12c in the parameter setting display area 11b of FIG. 4 is selected.

On the other hand, when the matrix scan function is executed for a certain cell, in a state where the check box 13 of "Full Scan" is not checked, "Start from Selected Cell" or "Scan Scenario" is selected, and the "Scenario Edit" button 14 in "Full Scan" is pressed to display the matrix scan edit screen 15 of FIG. 5.

Here, when "Start from Selected Cell" is selected and the "Scenario Edit" button 14 is pressed in a state where the check box 13 in "Full Scan" is not checked, a cell in which the matrix scan function is started to be executed is selected from the "Edit selection combo box" 16 with a mouse, and the "ON" button is pressed, on the matrix scan edit screen 15 of FIG. 5.

Further, when "Scan Scenario" is selected and the "Scenario Edit" button 14 is pressed in a state where the check box 13 in "Full Scan" is not checked, on the matrix scan edit screen 15 of FIG. 5, a scenario (for example, "Scenario 0") as an editing target is selected from the pull-down menu of the "Edit selection combo box" 16, the cell as the scanning target is selected from the matrix in the "Scan target selection matrix" 17 with the mouse, and the "ON" button is pressed.

When the cell selected with the mouse from the matrix of the "Scan target selection matrix" 17 is removed from the scanning target, the "OFF" button is pressed in a state where the cell to be removed from the scanning target is selected with the mouse. When all cells of the matrix are set as the scanning targets, the "All ON" button is pressed. When all the cells of the matrix are removed from the scanning targets, the "All OFF" button is pressed. When the "OK" button is pressed after editing of the cell as the scanning target is terminated, the editing result is stored in the storage unit 5.

Then, under the control of the control unit 6, the data transmission unit 3 in the error rate measurement apparatus 1 sequentially generates test signals based on the parameters of the scanning target, and transmits the sequentially generated test signals to the device under test W (ST2). That is, the test signal obtained by emphasizing the test pattern selected by the operation display unit 2 based on the parameter value including the table of the triangular matrix mapped from each coefficient of the preset cursor value defined by the PCIe Gen6 standard is sequentially generated, and the test signal is transmitted to the device under test W.

Here, a generation method of the test signal will be described. When the test signal is generated, PS2, PS1, DE, and Boost at $C_{-2}$, $C_{-1}$, and $C_{+1}$ of the cell as the scanning target are calculated by using the correction expressions (1) to (4) stored in the storage unit 5. The coefficient values of $C_{-2}$, $C_{-1}$, and $C_{+1}$ of the cell as the scanning target can be obtained from the Swing value/Full Swing value (either 24, 48, or 63). For example, for $C_{-2}$, the coefficient value when the swing value=2 and the full swing value=24 is 2/24=0.083333.

Va, Vb, Vc1, Vc2, and Vd are calculated from the total amplitude value (value determined by the device under test W) of the data transmission unit (signal generator) 3 and the ratio of emphasis (de-emphasis as an actual phenomenon) based on calculated PS2, PS1, DE, and Boost: PS2=20 log 10 (Vc2/Vb), PS1=20 log 10 (Vc1/Vb), DE=20 log 10 (Vb/Va), and Boost=20 log 10 (Vd/Vb). Then, the test signal obtained by emphasizing the test pattern selected by the operation display unit 2 based on the calculation results is generated.

In the device under test W, the data reception unit W2 receives the test signal sequentially transmitted from the data transmission unit 3 of the error rate measurement apparatus 1 under the control of the control unit W1, and the data transmission unit W3 returns and transmits a response signal to the received test signal to the error rate measurement apparatus 1 as the measurement target signal.

In the error rate measurement apparatus 1, the data reception unit 4 receives the measurement target signal sequentially returned and transmitted from the data transmission unit W3 of the device under test W (ST3). When the data reception unit 4 receives the measurement target signal from the device under test W, a bit error measurement unit 4a counts the bit errors in the measurement target signal, and measures the bit error rate (ST4).

When the bit error rate is measured by the bit error measurement unit 4a, under the control of the display control unit 6b, the error rate measurement apparatus 1 performs the displays of the measurement results on the display screen of the operation display unit 2 in the measurement result display area 11c (table display area 21, detailed display area 22) as shown on the matrix scan display screen 11 in FIGS. 2 to 4, for example, (matrix display in which the bit error rate for each cell is color-coded according to the error degree, three-dimensional bird-eye display by three axes (X-axis, Y-axis, and Z-axis) of $C_{-2}$, $C_{+1}$, and $C_{-1}$, and thumbnail display with the reduced image in which the bit error rate for each cell is color-coded according to the error degree) (ST5).

As described above, in the present embodiment, the coefficient value of $C_{-2}$ is selectably displayed by the tabs of the number corresponding to the Full Swing value defined by the PCIe Gen6 standard, each one of the combinations of the coefficient value of $C_{-2}$, each coefficient value of $C_{+1}$, and each coefficient value of $C_{-1}$ on the selected tab is used as the cell, the error count value and the bit error rate for each cell, which are obtained by the matrix scan function, are displayed on the display screen in a matrix, and the bit error rate for each cell is displayed on the display screen in a color-coded manner according to the error degree.

Further, $C_{-2}$, $C_{-1}$, and $C_{+1}$ are displayed on the display screen in the three-dimensional bird-eye view by using $C_{+1}$ and $C_{-1}$ as the combination of the horizontal direction coordinate axis (X-axis) and the vertical direction coordinate axis (Y-axis) and $C_{-2}$ as the depth direction coordinate axis (Z-axis). Further, a thumbnail image is displayed on the display screen as a reduced image in which the bit error rate for each cell is displayed in a color-coded manner according to the error degree.

As a result, it is possible to visually determine the optimum setting for the receiver of the device under test in the PCIe Gen6 standard by displaying the bit error rate of the cell as the scanning target of the triangular matrix mapped by the combination of coefficient values of (Pre-shoot2, Pre-shoot1, and De-emphasis) with respect to the Cursor value (Pre-shoot2) that is newly defined in the PCIe Gen6 standard in addition to the Cursor value (Pre-shoot1 and De-emphasis) in the related art, according to the error degree by a graphical user interface (GUI) in a color-coded matrix manner, or a three-dimensional bird-eye view, and displaying a thumbnail image in which the bit error rate for each cell is color-coded according to an error degree.

Furthermore, in the present embodiment, a range including at least one cell as the scanning target is selected and set in the matrix display or the bird-eye view described above, and the matrix scan function is executed by using the parameter values of the selected range. In addition, it is possible to store a plurality of scenarios including of cells with combinations of different parameter values (which can include cells with the parameter values designated by the standard), select and set one scenario from the plurality of stored scenarios, and execute the matrix scan function with the parameter values of the selected and set scenario.

As a result, although the conventional matrix scan function only supports two types of measurements: measurement for all cells in the triangular matrix by Full Scan, and measurement for all cells after the measurement start cell in the triangular matrix, it is possible to widen the selection range of the scanning target, efficiently perform a BER measurement test of the PCIe Gen6 standard, and improve the debugging efficiency of the user.

Hitherto, the best mode of the error rate measurement apparatus and the error rate measurement method according to the present invention has been described above, but the present invention is not limited by the description and drawings according to this mode. That is, other modes, embodiments, operation techniques, and the like made by the persons skilled in the art based on this mode are all included in the scope of the present invention.

DESCRIPTION OF REFERENCE NUMERALS AND SIGNS

1 Error Rate Measurement Apparatus
2 Operation Display Unit
3 Data Transmission Unit
3a Emphasis Control Unit
4 Data Reception Unit
4a Bit Error Measurement Unit
5 Storage Unit
6 Control Unit
6a Link State Management Unit
6b Display Control Unit
11 Matrix Scan Display Screen
11a "Start" Key
11b Parameter Setting Display Area
11c Measurement Result Display Area
12a [Measurement] Tab
12b [Starting Preset] Tab
12c [Scan] Tab
13 Check Box
14 "Scenario Edit" Button
15 Matrix Scan Edit Screen
16 Edit Selection Combo Box
17 Scan Target Selection Matrix
18 Scan Target Diagram
21 Table Display Area
22 Detailed Display Area
W Device Under Test
W1 Control Unit
W1a Link State Management Unit
W2 Data Reception Unit
W2a Equalizer
W3 Data Transmission Unit

What is claimed is:

1. An error rate measurement apparatus that executes a matrix scan function of measuring a bit error rate by transmitting a test signal by a combination of coefficient values in a Full Swing value defined by a PCI Express standard to a device under test during link training, and receiving a measurement target signal returned back from the device under test in response to transmission of the test signal, wherein:
   the test signal is based on a parameter value of a cell as a scanning target selected and set from a triangular matrix by the combination of the coefficient values,
   three types of coefficient values comprising first, second and third coefficient values are provided in the Full Swing value, and
   the error rate measurement apparatus comprises:
      a display controller configured to:
         display the first coefficient value in a selectable manner by tabs of a number corresponding to the Full Swing value,
         perform matrix display on a display screen by using each one of combinations of each of the second coefficient values and each of the third coefficient values in the first coefficient value on the selected tab, as the cell, and
         display each coefficient value on the display screen in a three-dimensional bird-eye view by using each second coefficient value and each third coefficient value as a combination of a horizontal direction coordinate axis and a vertical direction coordinate axis, and using the first coefficient value as a depth direction coordinate axis;
      an operation display configured to select a range including at least one cell as a scanning target in the matrix display or the bird-eye view display; and a controller configured to execute the matrix scan function with a parameter value in the range selected by the operation display.

2. The error rate measurement apparatus according to claim 1, wherein:
   the first coefficient value is set as $C_{-2}$,
   each second coefficient value is set as $C_{+1}$,
   each third coefficient value is set as $C_{-1}$, the error rate measurement apparatus further comprises:
storage configured to store a plurality of scenarios including a cell of a combination with different parameter values, and
the controller is configured to select and set one scenario from the plurality of scenarios stored in the storage unit-and execute the matrix scan function with a parameter value of the selected and set scenario.

3. The error rate measurement apparatus according to claim 2, wherein the selected and set scenario includes a cell of a parameter value designated by the PCI Express standard.

4. An error rate measurement method for executing a matrix scan function of measuring a bit error rate by transmitting a test signal by a combination of coefficient values in a Full Swing value defined by a PCI Express standard to a device under test during link training, and receiving a measurement target signal returned back from the device under test in response to transmission of the test signal, wherein;
the test signal is based on a parameter value of a cell as a scanning target selected and set from a triangular matrix by the combination of the coefficient values,
three types of coefficient values are provided in the Full Swing value, and
the error rate measurement method comprises:
displaying a first coefficient value in a selectable manner by tabs of a number corresponding to the Full Swing value;
performing matrix display on a display screen by using each one of combinations of each second coefficient value and each third coefficient value in the first coefficient value on the selected tab, as the cell;
displaying each coefficient value on the display screen in a three-dimensional bird-eye view by using each second coefficient value and each third coefficient value as a combination of a horizontal direction coordinate axis and a vertical direction coordinate axis, and using the first coefficient value as a depth direction coordinate axis;
selecting a range including at least one cell as a scanning target in the matrix display or the bird-eye view display; and
executing the matrix scan function with a parameter value in the selected range.

5. The error rate measurement method according to claim 4, wherein
the first coefficient value is set as $C_{-2}$,
each second coefficient value is set as $C_{+1}$,
each third coefficient value is set as $C_{-1}$,
the error rate measurement method further comprises:
storing a plurality of scenarios including a cell of a combination with different parameter values; and
selecting and setting one scenario from the plurality of stored scenarios and executing the matrix scan function with a parameter value of the selected and set scenario.

6. The error rate measurement method according to claim 5, wherein the selected and set scenario includes a cell of a parameter value designated by the PCI Express standard.

* * * * *